US008435473B2

(12) United States Patent
Hosono et al.

(10) Patent No.: US 8,435,473 B2
(45) Date of Patent: May 7, 2013

(54) SUPERCONDUCTING COMPOUND AND METHOD FOR PRODUCING THE SAME

(75) Inventors: Hideo Hosono, Kanagawa (JP); Yoichi Kamihara, Tokyo (JP); Masahiro Hirano, Tokyo (JP); Toshio Kamiya, Kanagawa (JP); Hiroshi Yanagi, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 123 days.

(21) Appl. No.: 12/865,940

(22) PCT Filed: Feb. 17, 2009

(86) PCT No.: PCT/JP2009/052714
§ 371 (c)(1),
(2), (4) Date: Aug. 3, 2010

(87) PCT Pub. No.: WO2009/104611
PCT Pub. Date: Aug. 27, 2009

(65) Prior Publication Data
US 2011/0002832 A1    Jan. 6, 2011

(30) Foreign Application Priority Data
Feb. 18, 2008    (JP) .................................. 2008-35977

(51) Int. Cl.
| C01F 17/00 | (2006.01) |
| C01B 25/10 | (2006.01) |
| C01B 15/16 | (2006.01) |
| C01B 25/26 | (2006.01) |
| C01B 21/20 | (2006.01) |
| C01B 13/00 | (2006.01) |
| C01C 1/00 | (2006.01) |
| C01D 1/02 | (2006.01) |
| C01G 49/00 | (2006.01) |
| C01G 53/04 | (2006.01) |
| C01G 29/00 | (2006.01) |
| C01G 30/00 | (2006.01) |
| C01G 28/02 | (2006.01) |
| C01G 28/00 | (2006.01) |

(52) U.S. Cl.
USPC ........... 423/263; 423/301; 423/306; 423/385; 423/593.1; 423/594.1; 423/594.3; 423/594.7; 423/601; 423/617; 505/777; 505/810

(58) Field of Classification Search .................. 423/263, 423/300, 301, 306, 385, 593.1, 594.1, 594.3, 423/594.7, 601, 617; 505/810
See application file for complete search history.

(56) References Cited

FOREIGN PATENT DOCUMENTS
| JP | 2002-211916 A | 7/2002 |
| JP | 2004-262675 A | 9/2004 |
| JP | 2005-350331 A | 12/2005 |
| JP | 2007-320829 A | 12/2007 |

OTHER PUBLICATIONS

Kamihara et al., "Iron-Based Layered Superconductor La[O1−xFx]FeAs (x=0.05-0.12) with Tc=26 K", J. Am. Chem. Soc. 2008, 130, 3296-3297 (published on Web Feb. 23, 2008).*
Kamihara et al., "Iron-Based Layered Superconductor: LaOFeP", J. Am. Chem. Soc. 2006, 128, 10012-10013.*
JP2007-320829 Derwent abstract and English language Machine Translation. Hirano et al. Published Dec. 13, 2007.*
Takahashi et al., "Superconductivity at 43 K in an iron-based layered compound LaO1−xFxFeAs", Nature vol. 453, Apr. 15, 2008, 376-378.*
N. Tsuda et al, "Denki Dendosei Sankabutsu", Shokabo Publishing Co., Ltd, 1993, pp. 350-352.
S. Maekawa, "Oyo Butsuri", Applied Physics, 2006, pp. 17-25, vol. 75, No. 1.
Y. Maeno et al, "Superconductivity in a Layered Perovskite Without Copper", Nature 372, Dec. 8, 1994, pp. 532-534.
J. Nagamatsu et al, "Superconductivity at 39K in Magnesium Diboride", Nature 410, Mar. 1, 2001, pp. 63-64.
K. Takada et al, "Superconductivity in Two-Dimensional CoO2 layers", Nature 422, Mar. 6, 2003, pp. 53-55.
J. B. Torrance et al, "Properties That Change as Superconductivity Disappears at High-Doping Concentrations in La2−x Srx CuO4", Physical Review B, 1989, pp. 8872-8877, vol. 40.

TEMPERATURE-DEPENDENT CHANGE IN ELECTRICAL RESISTANCE (UPPER) AND MAGNETIZATION (LOWER)

Y. Kamihara et al, "Iron-Based Layered Superconductor: LaOFeP", Journal of the American Chemical Society, Jul. 15, 2006, pp. 10012-10013, vol. 128, No. 31.

T. Watanabe et al, "Nickel-Based Oxyphosphide Superconductor with a Layered Crystal Structure, LaNiOP", Inorganic Chemistry, Aug. 17, 2007, pp. 7719-7721, vol. 46, No. 19.

T. Watanabe et al, "Extended Abstracts (The 68th Autumn Meeting, 2007)", The Japan Society of Applied Physics, Sep. 2007, pp. 275, No. 1.

D. Johrendt et al, "Pnictide Oxides: A New Class of High-Tc Superconductors" Angewandte Chemie International Edition, Jun. 16, 2008, pp. 4782-4784, vol. 47, No. 26.

M. Tegel et al, "Synthesis, Crystal Structure and Superconductivity of LaNiPO", Solid State Sciences, 2008, pp. 193-197, No. 10.

Y. Kamihara et al, "Fe-kei Sojo Chodendotai LaOFeP no Denki Dendo Tokusei to Jisei", Abstracts of the Meeting of the Physical Society of Japan, Aug. 21, 2007, p. 609, vol. 62, No. 2.

H. Okada et al, "Pressure Effects on Oxypnictide Compounds LaFeAs(O1–xFx) and SmFeAsO", Program and Abstracts, High Pressure Conference of Japan, Nov. 1, 2008, pp. 166, vol. 18, Special Issue.

Watanabe, T., "Ni-based oxyphosphide superconductor, LaNiOP", The Second Korea-Japan Workshop on Nanomaterials for IT, Dec. 27, 2007, http://mat-gcoe-titech.jp/englevent/2007/12/post.php.

Watanabe, T., "Nickel-Based Oxyphosphide Superconductor with a Layered Crystal Structure, LaNiOP" Inorganic Chemistry, Aug. 17, 2007, http://pubs.acs.org/journals/index.html.

International Search Report of PCT/JP2009/052714, mailing date of Jun. 2, 2009.

* cited by examiner

*Primary Examiner* — Colleen Dunn
*Assistant Examiner* — Anthony J Zimmer
(74) *Attorney, Agent, or Firm* — Westerman, Hattori, Daniels & Adrian, LLP

(57) ABSTRACT

Disclosed is a superconducting compound which has a structure obtained by partially substituting oxygen ions of a compound, which is represented by the following chemical formula; LnTMOPn [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)] and has a ZrCuSiAs-type crystal structure (space group P4/nmm), with at least one kind of monovalent anion ($F^-$, $Cl^-$ or $Br^-$). The superconducting compound alternatively has a structure obtained by partially substituting Ln ions of the compound with at least one kind of tetravalent metal ion ($Ti^{4+}$, $Zr^{4+}$, $Hf^{4+}$, $C^{4+}$, $Si^{4+}$, $Ge^{4+}$, $Sn^{4+}$ or $Pb^{4+}$) or a structure obtained by partially substituting Ln ions of the compound with at least one kind of divalent metal ion ($Mg^{2+}$, $Ca^{2+}$, $Sr^{2+}$ or $Ba^{2+}$). The Tc of the superconducting compound is controlled in accordance with the ion substitution amount.

3 Claims, 12 Drawing Sheets

TEMPERATURE-DEPENDENT CHANGE
IN ELECTRICAL RESISTANCE (P)

TEMPERATURE-DEPENDENT CHANGE IN MAGNETIC MOMENT

TEMPERATURE-DEPENDENT CHANGE IN ELECTRICAL
RESISTANCE (UPPER) AND MAGNETIZATION (LOWER)

TEMPERATURE-DEPENDENT CHANGE IN ELECTRICAL RESISTANCE

TEMPERATURE-DEPENDENT CHANGE IN MAGNETIC SUSCEPTIBILITY ($\chi$)

TEMPERATURE-DEPENDENT CHANGE IN ELECTRICAL RESISTANCE

SUPERCONDUCTING COMPOUND AND METHOD FOR PRODUCING THE SAME

TECHNICAL FIELD

The present invention relates to a layered superconducting compound containing a transition metal element (Fe, Ru, Os, Ni, Pd or Pt) in a skeleton structure, and to a method for producing the same.

BACKGROUND ART

Since a superconducting phenomenon was discovered with respect to mercury in 1911, superconductivity has been found out with respect to many compounds and has been practiced in the form of, e.g., superconducting magnets and magnetic sensors (SQUID). Further, after discovery of a high-temperature superconductor (i.e., perovskite-type copper oxide), research and development of materials have been intensively performed aiming at room-temperature superconductors, and superconducting compounds having superconducting transition (critical) temperature (Tc) of 100K or higher have been found out.

Understanding of the superconductivity developing mechanism in the perovskite-type copper oxide has also been progressed (e.g., Non-Patent Documents 1 and 2). Further, as compounds containing transition metal ions other than copper or as novel compounds, $Sr_2RuO_4$ (Tc=0.93K) (Non-Patent Document 3), magnesium diboride (Tc=39K) (Non-Patent Document 4 and Patent Document 1), $Na_{0.3}CoO_2 \cdot 1.3H_2O$ (Tc=5K) (Non-Patent Document 5 and Patent Documents 2 and 3), etc. have been newly found out.

It is known that a strongly-correlated electron system compound exhibiting a greater interaction between conduction electrons in comparison with a conduction band width becomes a superconductor having a higher Tc at a higher possibility when the number of d-electrons has a specific value. The strongly-correlated electron system is realized in layered compounds having transition metal ions in skeleton structures. In many of those layered compounds, electrical conductivity is similar to that of a Mott insulator and an antiferromagnetic interaction acts between electron spins so as to array the electron spins in an antiparallel relation.

However, regarding $La_2CuO_4$ as one perovskite-type copper oxide, for example, it is confirmed that, in $La_{2-x}Sr_xCuO_4$ which is obtained by adding $Sr^{2+}$ to the $La^{3+}$ site and by substituting part of La with Sr, the compound comes into an itinerant electron state exhibiting metallic conductivity when a value of x is in the range of 0.05 to 0.28, a superconductor state is observed at low temperature, and maximum Tc=40K is obtained at x=0.15 (Non-Patent Document 6).

Recently, the inventors have found out that new strong electron correlation compounds containing Fe as a main component, i.e., LaOFeP and LaOFeAs, are superconductors, and have filed a patent application (Patent Document 4 and Non-Patent Document 7). More specifically, in a strong electron correlation system, an itinerant electron state exhibiting metallic conductivity is generated when the number of d-electrons has a specific value, and there occurs transition to a superconducting state at a particular temperature (superconducting transition temperature) or below when the temperature is lowered. Further, Tc of such a superconductor is changed over the range of 5K to 40K depending on the number of conduction carriers. Moreover, in conventional superconductors such as Hg and $Ge_3Nb$, electron pairs (Cooper pairs) attributable to heat fluctuation (lattice vibration) of crystal lattices are regarded as developing a superconductivity generating mechanism (BCS mechanism). On the other hand, regarding superconductivity of the strong electron correlation system, electron pairs attributable to heat fluctuation of electron spins are regarded as developing a superconductivity generating mechanism. Since then, it has been found out that LaONiP is also a superconductor (Non-Patent Documents 8 to 10).

In the above-mentioned superconducting compounds, electron pairs are in a spin singlet state where respective electron spins are arrayed antiparallel to each other. In $Sr_2RuO_4$ (Tc=0.93K) (Non-Patent Document 3), etc., however, superconductivity attributable to spin triplet electron pairs in which electron spins of the electron pairs are arrayed parallel to each other has been lately found out. Such a phenomenon is presumably based on the fact that those spin pairs exhibit a ferromagnetic interaction between their electron spins (i.e., an interaction to align the spins parallel to each other). For that type of superconductor, it is considered that a critical magnetic field at which the superconducting state is broken by a magnetic field is strong. Accordingly, that type of superconductor is superior when it is used in a ferromagnetic field (for example, when it is used as an inner coil in the case of generating a magnetic field in tandem).

Non-Patent Document 1: Nobuo Tsuda, Keiichiro Nasu, Atushi Fujimori, and Kiichi Shiratori, revised "*Denki Dendosei Sankabutsu* (Electrically Conductive Oxides)", pp. 350-452, Shokabo Publishing Co., Ltd., (1993)

Non-Patent Document 2: Sadamichi Maekawa, Oyo Butsuri (Applied Physics), Vol. 75, No. 1, pp. 17-25, (2006)

Non-Patent Document 3: Y. Maeno, H. Hashimoto, K. Yoshida, S. Nishizaki, T, Fujita, J. G. Bednorz, F. Lichtenberg, Nature, 372, pp. 532-534 (1994)

Non-Patent Document 4: J. Nagamatsu, N. Nakagawa, T. Muranaka, Y. Zenitani, and J. Akimitsu, Nature, 410, pp. 63-64, (2001)

Non-Patent Document 5: K. Takada, H. Sakurai, E. Takayama-Muromachi, F. Izumi, R. A. Dilanian, T. Sasaki, Nature, 422, pp. 53-55, (2003)

Non-Patent Document 6: J. B. Torrance et al., Phys. Rev., B40, pp. 8872-8877, (1989)

Non-Patent Document 7: Y. Kamihara et al., J. AM. CHEM. SOC., (Published on Web Jul. 15, 2006), 128, 10012-10013 (2006)

Non-Patent Document 8: T. Watanabe et al., Inorganic Chemistry, 46(19) (2007) 7719-7721 (Published on Web 17 Aug. 2007)

Non-Patent Document 9: T. Watanabe et al., Extended Abstracts (The 68th Autumn Meeting, 2007); The Japan Society of Applied Physics, No. 1, P. 275, 4γ-ZE-2 (2007)

Non-Patent Document 10: M. tegel et al., Solid State Science, 10 (2008)193-197 (Published on Web 2 Sep. 2007)

Patent Document 1: Japanese Unexamined Patent Application Publication No. 2002-211916

Patent Document 2: Japanese Unexamined Patent Application Publication No. 2004-262675

Patent Document 3: Japanese Unexamined Patent Application Publication No. 2005-350331

Patent Document 4: Japanese Unexamined Patent Application Publication No. 2007-320829

DISCLOSURE OF INVENTION

Problems to be Solved by the Invention

Discovery of a room-temperature superconductor is strongly demanded form the viewpoint of drastically spreading applications of the superconducting technology. A high-temperature superconductor having Tc in excess of 100K has been found out with respect to the layered perovskite-type copper oxide, but a room-temperature superconductor is not yet found out. One solution for developing the room-temperature superconductor is to find out, instead of the perovskite-type copper oxide, a new layered compound group having a transition metal element in a skeleton structure, to optimize material parameters, such as an electron density and a lattice constant, for obtaining a higher Tc, and to discover a compound composition to realize those points.

Means for Solving the Problems

The inventors have found out new superconductors by changing, in a chemical compound group LnTMOPn "wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)", the type of an ion of Ln (Y and rare earth metal element), TM (transition metal element), and/or Pn (pnictide element). Further, the inventors have found out that Tc can be controlled, for example, by adding impurities so as to dope electrons or holes, or to change the lattice constant of the LnTMOPn crystal. In addition, the inventors have determined the compound composition of LnTMOPn such that Tc takes a maximum temperature.

In addition, because an interaction between d-electrons of a transition metal plays a major role in the superconductivity developing mechanism, it is also required to control such an interaction. One method for controlling such an interaction is to find out a pnictide ion that is optimum as the transition metal element. In arsenic (As) ion and a phosphorous (P) ion, for example, p-d orbit hybridization is increased and the interaction between a carrier and an electron are enhanced because the energy level of a p-electron is close to that of a Fe3d electron in those ions. Further, it is effective to reduce the interaction between adjacent layers of a layered compound and to enhance an effect of enclosing electrons in each layer. The enclosed electrons have two-dimensional nature and impede magnetic alignment, thus facilitating development of superconductivity.

As a result of intensively studying the layered-structure compound LnTMOPn containing the transition metal ion in the skeleton structure, which has been newly found out by the inventors, in accordance with the above-mentioned basis for material research, the inventors have succeeded in not only realizing a new superconducting compound, but also in finding out a superconducting compound with Tc of 25K or higher by substituting oxygen ions of LnTMOPn with a different kind of ion in an appropriate amount and optimizing a concentration of the substituted ions. Further, the inventors have found out that Tc can also be raised by substituting Ln ions of the superconducting compound represented by LnTMOPh with at least one kind of tetravalent metal ion or at least one kind of divalent metal ion in an appropriate amount.

More specifically, the present invention resides in (1) a superconducting compound having a structure obtained by partially substituting oxygen ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)] and which has a ZrCuSiAs-type crystal structure (space group P4/nmm), with at least one kind of monovalent anion ($F^-$, $Cl^-$ or $Br^-$), thereby exhibiting superconducting transition.

Further, the present invention resides in (2) a superconducting compound having a structure obtained by partially substituting Ln ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)] and which has a ZrCuSiAs-type crystal structure (space group P4/nmm), with at least one kind of tetravalent metal ion ($Ti^{4+}$, $Zr^{4+}$, $Hf^{4+}$, $C^{4+}$, $Si^{4+}$, $Ge^{4+}$, $Sn^{4+}$ or $Pb^{4+}$), thereby exhibiting superconducting transition.

Still further, the present invention resides in (3) a superconducting compound having a structure obtained by partially substituting Ln ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)] and which has a ZrCuSiAs-type crystal structure (space group P4/nmm), with at least one kind of divalent metal ion ($Mg^{2+}$, $Ca^{2+}$, $Sr^{2+}$ or $Ba^{2+}$), thereby exhibiting superconducting transition.

Still further, the present invention resides in (4) the superconducting compound described in any one of above (1) to (3), wherein Ln represents at least one of La, Y and Lu, TM represents Ni or Fe, and Ph represents at least one of P, As and Sb.

Still further, the present invention resides in (5) the superconducting compound described in any one of above (1) to (3), wherein Ln represents Sm, TM represents Ni or Fe, and Ph represents P or As.

Still further, the present invention resides in (6) the superconducting compound described in above (1), wherein the compound represented by the chemical formula of LnTMOPh is LaFeOAs, the monovalent anion is $F^-$ (fluorine ion), and the oxygen ions are substituted with $F^-$ at 4 atom % or more, but 20 atom % or less.

Still further, the present invention resides in (7) a method for producing the superconducting compound described in above (1), wherein oxygen ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)], are partially substituted with at least one kind of monovalent anion ($F^-$, $Cl^-$ or $Br^-$), thereby forming a superconducting compound of which superconducting transition temperature is controlled in accordance with an ion substitution amount.

Still further, the present invention resides in (8) a method for producing the superconducting compound described in above (2), wherein Ln ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)], are partially substituted with at least one kind of tetravalent metal ion ($Ti^{4+}$, $Zr^{4+}$, $Hf^{4+}$, $C^{4+}$, $Si^{4+}$, $Ge^{4+}$, $Sn^{4+}$ or $Pb^{4+}$), thereby forming a superconducting compound of which superconducting transition temperature is controlled in accordance with an ion substitution amount.

Still further, the present invention resides in (9) a method for producing the superconducting compound described in above (3), wherein Ln ions of a compound, which is represented by a chemical formula of LnTMOPh [wherein Ln represents at least one element selected from Y and rare earth metal elements (La, Ce, Pr, Nd, Sm, Eu, Gd, Tb, Dy, Ho, Er, Tm, Yb and Lu), TM represents at least one element selected from transition metal elements (Fe, Ru, Os, Ni, Pd and Pt), and Pn represents at least one element selected from pnictide elements (N, P, As and Sb)], are partially substituted with at least one kind of divalent metal ion ($Mg^{2+}$, $Ca^{2+}$, $Sr^{2+}$ or $Ba^{2+}$), thereby forming a superconducting compound of which superconducting transition temperature is controlled in accordance with an ion substitution amount.

Advantages

The present invention provides a superconducting compound belonging to a compound group of a new system, which enables components to be combined with each other in a very large number, and which can realize a high superconducting transition temperature. Thus, the present invention provides a drastic advantage that leads to a breakthrough in development of novel superconducting materials.

BEST MODE FOR CARRYING OUT THE INVENTION

Figure 1:
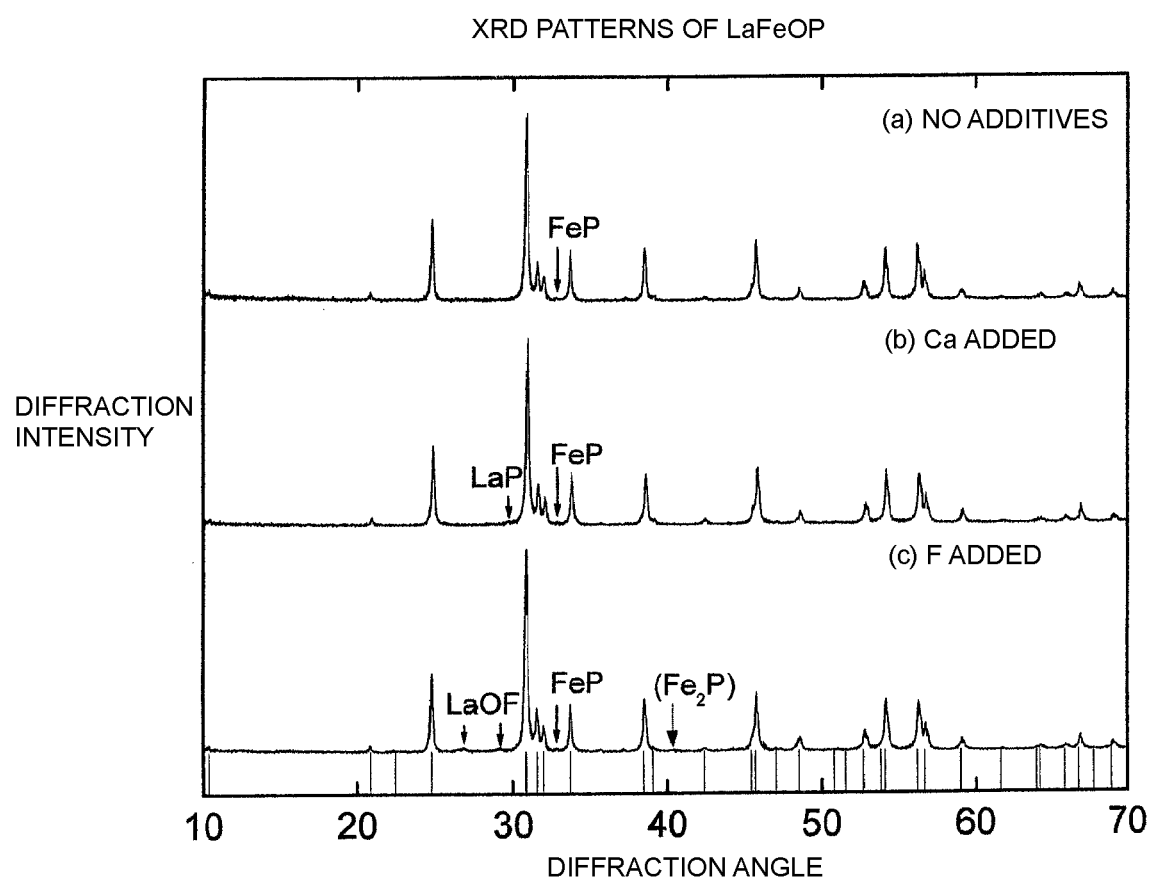
FIG. 1 shows X-ray diffraction patterns of sintered bodies obtained in COMPARATIVE EXAMPLE 1, EXAMPLE 1, and EXAMPLE 2.

A superconducting compound according to the present invention belongs to a layered compound group, which is represented by a general chemical formula of LnTMOPn and which contains a transition metal element in a skeleton structure. All compounds in the layered compound group have a ZrCuSiAs-type crystal structure (space group P4/nmm). In the general chemical formula, Ln represents at least one of Y and rare earth metal elements selected from La, Ce, Pr, Nd, Sm, Eu, Gd, Tb, Dy, Ho, Er, Tm, Yb and Lu, TM represents at least one of transition metal elements selected from Fe, Ru, Os, Ni, Pd and Pt, and Pn represents at least one of pnictide elements selected from N, P, As and Sb.

The crystal structure of the above-mentioned compound group is a layered structure in which an LnO layer having low electrical conductivity and a TMPn layer exhibiting metallic electrical conductivity are alternately laminated. Therefore, electrons contributing to electrical conduction or superconduction are two-dimensionally enclosed in the TMPn layers. The two-dimensional nature of the enclosed electrons causes a strong interaction between the electrons and suppresses magnetic alignment of electron spins. In order to develop superconductivity, it is essential to reduce the magnetic interaction between conduction electrons down to such a level as suppressing development of the magnetically aligned state. On the other hand, superconductivity due to d-electrons is developed with heat fluctuation of the magnetic interaction between conduction electrons. It is hence considered that the superconducting transition temperature (Tc) increases as the magnetic interaction increases within the range where the magnetic alignment is not caused.

Generally, the magnitude of the magnetic interaction is given by the product of the magnetic moment of the conduction electrons and the magnitude of an exchange interaction between the conduction electrons. In order to suppress development of a magnetically aligned phase, therefore, it is first required that the electron magnetic moment is small. In a d-electron system of the transition metal element having an even number (n) of d-electrons, the magnetic moment can be made zero as a whole by arraying respective spins of the number n/2 of electrons antiparallel to each other. For that reason, $Fe(3d^6)$, $Ru(4d^6)$, $Os(4d^7)$, $Ni(3d^8)$, $Pd(4d^8)$, and $Pt(5d^8)$, in each of which n is even, are selected as the transition metal elements contained in the skeleton structure. Regarding the d-electron in a solid, it is known that the effective mass of the electron increases and hence Tc tends to lower as the principal quantum number increases. Accordingly, Fe and Ni are most desirable which include 3d electrons each having the minimum principal quantum number.

The exchange interaction increases as covalent bonding between elements becomes stronger. The bonding of TM-Pn is stronger than that of TM-Ch(O, S, Se), for example. In the LnTMOPn compound group, therefore, the exchange interaction between the d-electrons is greater than that in simple oxides and the superconduction phase is more likely to develop. Generally, a rare earth metal ion having a magnetic moment acts to inhibit development of the superconduction phase. In the LnTMOPn compound group, however, because an LnO layer and a TMAs layer are spatially away from each other, an inhibitory effect attributable to the magnetic moment is deemed to be small.

Y, La and Lu, each having no magnetic moment, are desired elements for the reason that they do not have the inhibitory effect attributable to the magnetic moment against the development of the superconduction phase in principle. Because those elements differ in ion radius from each other, the lattice constant also differs in the LnTMOPn compounds containing those elements. As a result, the size of covalent range of a TM-Pn bond is indirectly affected and Tc is changed. A La ion is optimum in view of that the size of the ion radius is appropriate and the compound is easier to synthesize.

The number and the state of electrons contributing to electrical conduction or superconduction can be finely changed by adding an ion having a different charge from that of a constituent element of the LnTMOPn compound, thereby partially substituting O or Ln with the added ion. As a result of such a change, Tc can be controlled depending on an amount of the substituted ion. The ion having a different charge is more desirably added to the LnO layer than to the TMPn layer. The reason is that addition of the ion to the TMPn layer has a higher possibility of thoroughly destroying the superconduction phase. On the other hand, addition of the ion to the LnO layer supplies electrons or holes to the TMPn layer, but it does not significantly change TMPn and hence does not drastically destroy the superconduction phase.

In more detail, electrons can be supplied to the TMPn layer and Tc can be raised by substituting oxygen ions ($O^{2-}$) in the LnO layer with monovalent anions ($F^-$, $Cl^-$ or $Br^-$) in part, preferably at about 25 mol % or less. As described in EXAMPLE 3 and EXAMPLE 6, particularly, Tc is raised to 20K or above by substituting oxygen ions in the LaFeOAs and SmFeOAs with fluorine ions ($F^-$) at about 4 atom % or more, but about 20 atom % or less.

Further, Tc can be changed by substituting Ln ions ($Ln^{3+}$) in the LnO layer with divalent metal ions ($Mg^{2+}$, $Ca^{2+}$, $Sr^{2+}$ or $Ba^{2+}$) at about 25 mol % or less. As described in EXAMPLE 2, Tc is raised 2K or more by adding $Ca^{2+}$ to LaFeOP and partially substituting La ions with Ca ions, and by adding $Ca^{2+}$ to LaNiOP and LaNiOAs and partially substituting La ions with Ca ions. Further, by substituting Ln ions ($Ln^{3+}$) in the LnO layer tetravalent metal ions ($Ti^{4+}$, $Zr^{4+}$, $Hf^{4+}$, $C^{4+}$, $Si^{4+}$, $Ge^{4+}$, $Sn^{4+}$ or $Pb^{4+}$) at 25 mol % or less, Tc can be controlled depending on an ion substitution amount.

Presumably, the addition of the above-mentioned ion having a different charge causes change of the lattice constant, and such a change affects Tc. In addition, a deviation of the content of each of Pn and the oxygen ion ($O^{2-}$) from the chemical equivalent composition also causes change of the lattice constant, and such a change affects Tc. In an extreme case, the superconduction phase disappears or newly appears. It is deemed that sensitiveness of Tc upon the compound composition is attributable to the superconductivity developing mechanism itself of an oxypnictide compound in the present invention.

The superconducting compound of the present invention may be in the form of a sintered polycrystalline body, a single crystal, or a thin film. The sintered polycrystalline body of LnTMOPn can be obtained by mixing raw-material powder of the monovalent anion, the divalent metal ion, or the tetravalent metal ion to a powder mixture, preferably in a sintered state, which is prepared by mixing a single metal, a pnictide, and an oxide corresponding to the constituent elements of the LnTMOPn compound at a chemical equivalent ratio, and by sintering those mixed materials at temperature of about 800° C. or above, but 1800° C. or below, preferably at temperature of about 1000 to 1300° C., in an inert atmosphere. If the temperature is lower than 800° C., the reaction among the raw materials is not progressed and the LnTMOPn phase cannot be obtained. If the temperature exceeds 1800° C., easily-volatile components are lost and compounds in phases differing from the LnTMOPn phase are produced, thus providing an unsatisfactory result. The single crystal of the LnTMOPn compound can be grown from the above-mentioned mixed powder by using metal salt, such as KCl or NaCL, as a flux.

The thin film of the LnTMOPn compound can be obtained as follows. First, a very thin film of TM, serving as a template, is formed on a single-crystal substrate by vapor deposition. On the very thin film of TM, an amorphous film is then deposited with a gas-phase process (such as pulse-laser vapor deposition or sputtering) by using, as a target, the sintered polycrystalline body that has been obtained in accordance with the above-described method. Finally, a resulted multilayer film is annealed at temperature of about 800° C. or above, but 1800° C. or below in an inert atmosphere.

A method for producing a sintered polycrystalline body of the superconducting compound according to the present invention will be described in detail below in connection with LaFeOAs, for example. First, a mixture prepared by mixing respective powders of La, Fe and As at a molar ratio of 1:3:3 is put in a quartz tube. After evacuating the interior of the quartz tube into a vacuum state, an inert gas is introduced to there at room temperature. The inert gas is suitably an Ar gas, but it is not limited to the Ar gas. Pressure of the inert gas is required to be 1 atm or less. By enclosing the inert gas, the quartz glass tube can be prevented from breaking due to shrinkage during the sintering. The enclosed inert gas is further effective in suppressing evaporation of an arsenic compound having a high vapor pressure and in avoiding a composition deviation of a sintered body from the chemical equivalent composition.

A mixture prepared by mixing the obtained sintered body (mixture of LaAs, $Fe_2As$ and FeAs) and dehydrated $La_2O_3$ at a molar ratio of 1:1 between La and Fe is put in a quartz tube. After evacuating the interior of the quartz tube into a vacuum state, an inert gas is introduced to there at room temperature. When fluorine is doped into LaFeOAs, a mixture of $LaF_3$ and La is added to the above-mentioned mixture at a molar ratio of about 0.01 or more, but 0.2 or less with respect to $La_2O_3$.

The sintering is performed in an inert gas atmosphere while the mixture to be sintered is heated to and held at 1100° C. to 1250° C. Preferably, the quartz tube including the mixture enclosed therein is heated to about 1200° to 1250° C. and is held under such a condition for about 40 hours. In consideration of that As of the arsenic compound is apt to sublimate, a compound having the chemical equivalent composition can be obtained by adding As in a larger amount than a theoretical value by about 2 mol % to the mixed powder. Then, the quartz tube is cooled down to about 1100 to 1050° C. and is held under such a condition for 10 hours. Thereafter, the quartz tube is cooled down to room temperature at a rate of about 250° C./hour. The reason why the temperature is raised to about 1200 to 1250° C. is to increase a chemical reaction rate and to provide a single phase of LaFeOAs. The reason why the temperature is held at about 1100 to 1050° C. for a long time thereafter is to increase a burning degree. If the mixture is held at about 1200 to 1250° C. for a long time, Ar is volatized and a different phase is generated.

Figure 4:
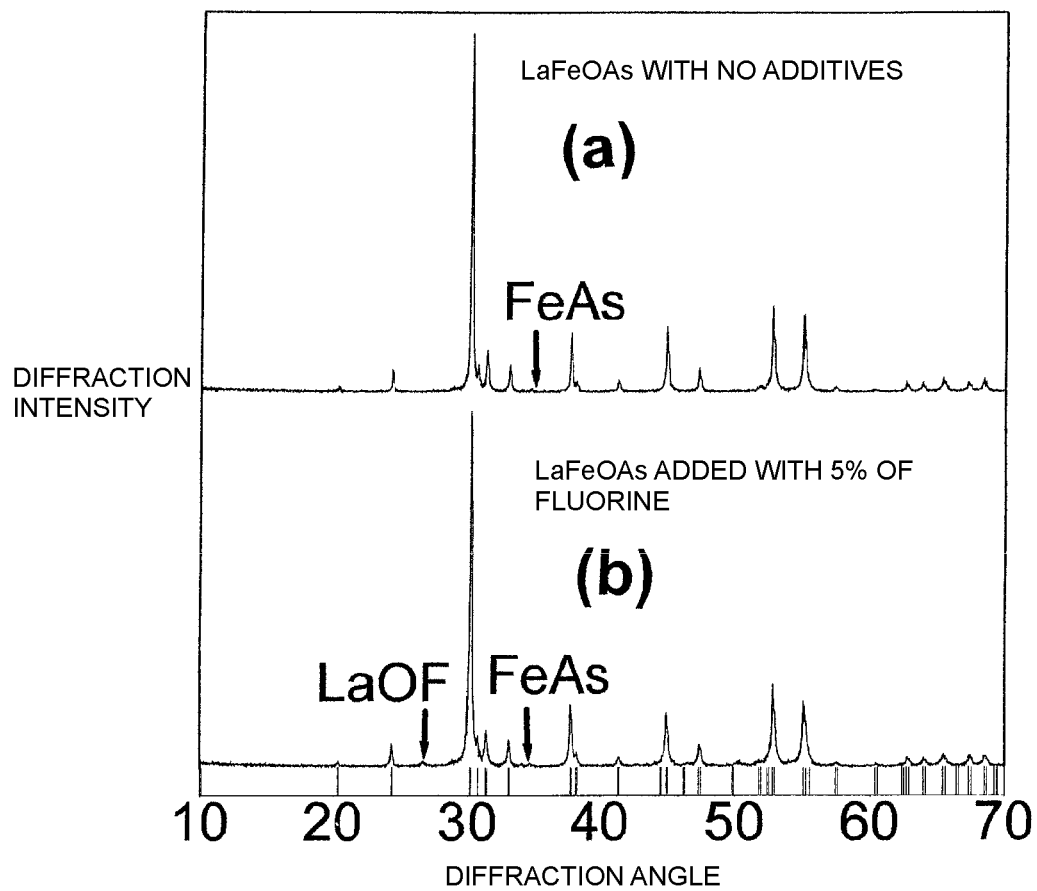
FIG. 4 shows X-ray diffraction patterns of sintered bodies obtained in COMPARATIVE EXAMPLE 3 and EXAMPLE 3.

FIG. 4(a) shows an X-ray diffraction pattern of a sintered body obtained in COMPARATIVE EXAMPLE 3. As seen from FIG. 4(a), the crystal structure of the relevant sintered body is a ZrCuSiAs type (space group P4/nmm), and such a phase is constituted in excess of 90%.

By using the pulse-laser deposition process with the relevant sintered body set as a target, a thin film of LaFeOAs can be formed on a substrate of MgO, which is heated to temperature of 550° C. to 900° C. and preferably 600° C. to 700° C. While the substrate is suitably made of MgO, other substrates made of silica glass, alumina, yttrium-stabilized zirconia, etc., which are endurable against temperature of 900° C., can also be used. Alternatively, a thin film of LaFeOAs may be deposited on a substrate at room temperature, and the substrate may be enclosed in a silica glass together with an inert gas and then annealed by heating it to 900° C. to 1100° C. for a time shorter than 10 hours. While the pulse-laser deposition process is a simple method for depositing the LaFeOP film, other gas-phase processes, such as sputtering and vapor deposition, can also be used.

Figure 2:
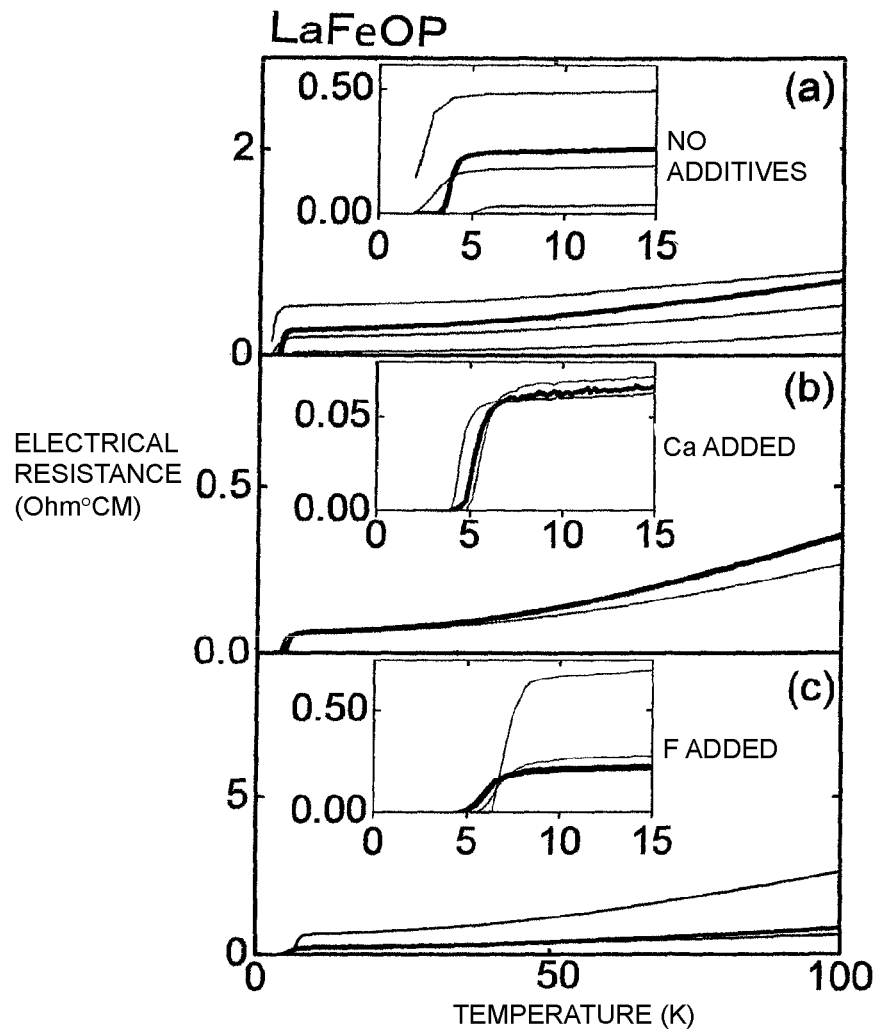
FIG. 2 is a graph showing temperature-dependent changes in electrical resistivity of the sintered bodies obtained in COMPARATIVE EXAMPLE 1, EXAMPLE 1, and EXAMPLE 2.
Figure 3:
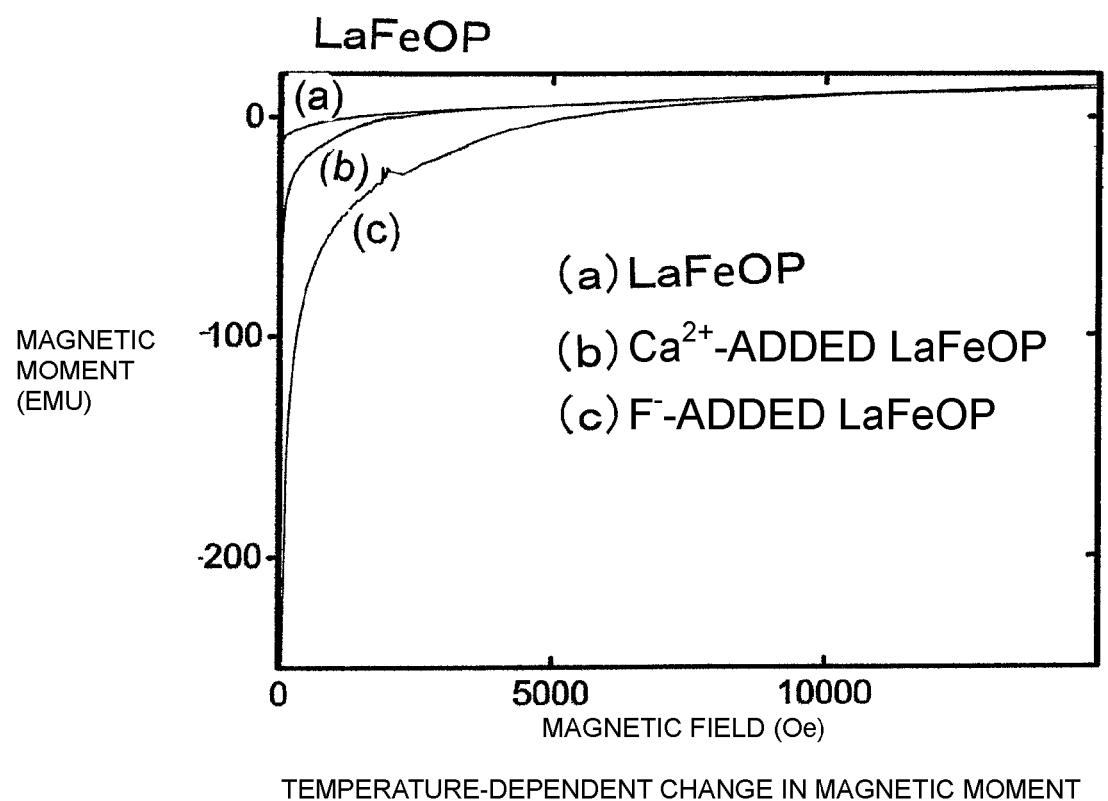
FIG. 3 is a graph showing temperature-dependent changes in magnetic moment (EMU) near Tc of the sintered bodies obtained in COMPARATIVE EXAMPLE 1, EXAMPLE 1, and EXAMPLE 2.

FIG. 2 shows temperature-dependent change in electrical resistivity of the sintered body obtained in COMPARATIVE EXAMPLE 1. As seen from FIG. 2, electrical resistance of the obtained sintered body reaches zero at about 5K at which the relevant sintered body has transited to the superconduction phase. In the superconduction phase, magnetic susceptibility appears as perfect diamagnetic susceptibility due to the Meissner effect. Therefore, the transition of the relevant compound to the superconduction phase can be confirmed from the temperature-dependent change in the magnetization, which is shown in FIG. 3. The present invention will be described in more detail below in connection with EXAMPLES and COMPARATIVE EXAMPLES.

COMPARATIVE EXAMPLE 1

Sintered Polycrystalline Body of LaFeOP

Commercially available $La_2O_3$ (purity of 99.99 mol %, made by Japan Pure Chemical Co., Ltd.) was heated in air at 600° C. for 10 hours and then dehydrated. Further, a La metal (purity of 99.5 mol %, made by Shin-Etsu Chemical Co., Ltd.), a Fe metal (purity of 99.9 mol %, made by Japan Pure Chemical Co., Ltd.), and P (purity of 99.999%, made by Rare Metallic Co., Ltd.) were mixed at a molar ratio of 1:3:3. Weighing, pulverization into fine powder, and mixing of those raw materials were all performed in a dry box filled with a dried inert gas. Next, the mixed powder (called mixed powder A) was enclosed in a silica tube and was baked at 700° C. for 10 hours while the interior of the silica tube was held at room temperature and filled with a 0.1-atm argon gas.

A thus-obtained baked body was a mixture (called a mixture A) of LaP, $Fe_2P$ and FeP. The mixture A and dehydrated $La_2O_3$ were mixed in the dry box at a molar ratio of 1:1. The mixed materials were enclosed in a silica tube and were sintered at 1200° C. for 40 hours in the same manner as that used to obtain the mixture A. From an X-ray diffraction (XRD) pattern ("no additives") shown in FIG. 1(a), it was proved that a sintered body obtained here was a polycrystalline body of LaFeOP having purity of 90% or more.

The electrical resistance of the sintered polycrystalline body of LaFeOP, obtained as described above, was measured over the range of 2K to 300K by forming electrodes with silver pastes and by employing the 4-terminal method. Further, the magnetic moment was measured over the temperature range of 1.8 to 300K by using a sample vibrating magnetometer (VSM apparatus). A PPMS apparatus made by Quantum Design Physical Co. was used for the latter measurement.

As shown in FIG. 2(a), the electrical resistance quickly decreased in the temperature range of 2 to 4K and reached zero. As shown in FIG. 3(a), the magnetization also quickly decreased in the same temperature range and turned to a minus value. From the zero electrical resistance and the minus magnetization (Meissner effect), it was confirmed that the obtained polycrystalline body of LaFeOP was a superconductor. Further, Tc varied among samples prepared. Such a variation in Tc is presumably due to a deviation of the content of the oxygen ion ($O^{2-}$) or the phosphorous element (P) from the chemical equivalent composition. The magnitude of the deviation can be evaluated based on the lattice constant. For the obtained polycrystalline bodies of LaFeOP, it was proved that there is good correlation between the lattice constant and Tc, and that Tc increases as the lattice constant decreases.

EXAMPLE 1

Sintered Polycrystalline Body of $F^-$-Added LaFeOP

10 Mol % of anhydrous $La_2O_3$ produced in COMPARATIVE EXAMPLE 1 was substituted with powder prepared by mixing $LaF_3$ and a La metal at a molar ratio of 1:1. Thus-obtained powder and the mixture A were mixed at a molar ratio of 1:1. The mixed materials were enclosed in a silica tube and were sintered at 1200° C. for 40 hours in the same manner as that described in COMPARATIVE EXAMPLE 1.

From an XRD pattern ("$F^-$-added") shown in FIG. 1(c), it was confirmed that a sintered body obtained here had the LaFeOP phase with purity of 90% or more. Also, partial substitution of $O^{2-}$ with $F^-$ was proved from a reduction of the lattice constant in comparison with that of the polycrystalline body of LaFeOP obtained in COMPARATIVE EXAMPLE 1.

Temperature-dependent changes in electrical resistance and magnetization of a sintered polycrystalline body of $F^-$-added LaFeOP, produced as described above, were measured under the same conditions as those in the method described in COMPARATIVE EXAMPLE 1. As shown in FIG. 2(c) and FIG. 3(c) ("$F^-$-added"), the electrical resistance reached zero at nearly 7K and the magnetization exhibited a minus value at the same temperature. From those points, it was proved that the sintered polycrystalline body of $F^-$-added LaFeOP developed the superconducting transition. Tc was raised 3K or more as a result of substituting an appropriate amount of $O^{2-}$ with $F^-$.

EXAMPLE 2

Sintered Polycrystalline Body of $Ca^{2+}$-Added LaFeOP

A Fe metal and P were mixed at a molar ratio of 1:1. An obtained mixture was enclosed in a silica tube together with an argon gas and was baked at 1,000° C. for 10 hours, thereby producing FeP. Further, $CaCO_3$ (purity of 99.99%, made by Japan Pure Chemical Co., Ltd.) was baked in air at 920° C. for 10 hours, thereby producing anhydrous CaO. Those FeP and CaO were mixed with the mixture A that was prepared in COMPARATIVE EXAMPLE 1 to produce the sintered body of LaFeOP. The mixed materials were enclosed in a silica tube together with an argon gas and were sintered at 1200° C. for 40 hours in the same manner as that described in COMPARATIVE EXAMPLE 1.

From an XRD pattern ("Ca added") shown in FIG. 1(b), it was confirmed that a sintered body obtained here had the LaFeOP phase with purity of 90% or more. Also, partial substitution of $Ca^{2+}$ with $La^{3+}$ was proved from a reduction of the lattice constant in comparison with that of the polycrystalline body of LaFeOP obtained in COMPARATIVE EXAMPLE 1.

Temperature-dependent changes in electrical resistance and magnetization of a sintered polycrystalline body of $Ca^{2+}$-added LaFeOP, produced as described above, were measured in the same manner as that described in COMPARATIVE EXAMPLE 1. As shown in FIG. 2(b) and FIG. 3(b) ("$Ca^{2+}$ added"), the electrical resistance reached zero at nearly 5K and the magnetization exhibited a minus value at the same temperature. From those points, it was proved that the sintered polycrystalline body of $Ca^{2+}$-added LaFeOP developed the superconducting transition. Tc was raised about 1K as a result of substituting an appropriate amount of $La^{3+}$ with $Ca^{2+}$.

COMPARATIVE EXAMPLE 2

Sintered Polycrystalline Body of SmFeOP

A sintered body was produced under the same conditions as those in COMPARATIVE EXAMPLE 1 except that the metal La in COMPARATIVE EXAMPLE 1 was substituted with a Sm metal. The produced sintered body was a polycrystalline body of SmFeOP having purity of 90% or more. Further, the produced sintered body was a superconductor having Tc of 2K, judging from temperature-dependent changes in electrical resistance and magnetization of the produced sintered. It was also proved that, when La was completely substituted with Sm, the superconduction phase was developed, but Tc was lowered.

COMPARATIVE EXAMPLE 3

Sintered Polycrystalline Body of LaFeOAs

Commercially available $La_2O_3$ (purity of 99.99 mol %, made by Japan Pure Chemical Co., Ltd.) was heated in air at 600° C. for 10 hours and then dehydrated. Further, a La metal (purity of 99.5 mol %, made by Shin-Etsu Chemical Co., Ltd.), a Fe metal (purity of 99.9 mol %, made by Japan Pure Chemical Co., Ltd.), and As (purity of 99.999%, made by Rare Metallic Co., Ltd.) were mixed at a molar ratio of 1:3:3. Weighing, pulverization into fine powder, and mixing of those raw materials were all performed in a dry box filled with a dried inert gas. Next, the mixed powder (called mixed powder B) was enclosed in a silica tube and was baked at 700° C. for 10 hours while the interior of the silica tube was held at room temperature and filled with a 0.1-atm argon gas. A thus-obtained baked body was a mixture (called a mixture B) of LaAs, $Fe_2As$ and FeAs. The mixture B and dehydrated $La_2O_3$ were mixed in the dry box at a molar ratio of 1:1. The mixed materials were enclosed in a silica tube and were sintered at 1200° C. for 40 hours in the same manner as that used to obtain the mixture B.

From an XRD pattern ("LaFeOAs with no additives") shown in FIG. 4(a), it was confirmed that a sintered body obtained here was a polycrystalline body of LaFeOAs having purity of 90 mol % or more.

EXAMPLE 3

Polycrystalline Body of $F^-$-Added LaFeOAs

X mol % (X=0 mol % to 20 mol %) of anhydrous $La_2O_3$ produced in COMPARATIVE EXAMPLE 1 was substituted with powder prepared by mixing $LaF_3$ and a La metal at a molar ratio of 1:1. Thus-obtained powder and the mixture B were mixed at a molar ratio of 1:1. The mixed materials were enclosed in a silica tube together with an argon gas and were sintered at 1200° C. for 40 hours in the same manner as that described in COMPARATIVE EXAMPLE 1.

From an XRD pattern ("LaFeOAs added with 5 mol % of fluorine") shown in FIG. 4(b), it was confirmed that a sintered body obtained here had the LaFeOP phase with purity of 90% or more. Also, the lattice constant decreased substantially in proportion to a value of X mol %. A substitution amount of $O^{2-}$ with $F^-$ was determined from a reduction of the measured lattice constant. The content of $F^-$ was possible up to about 20 mol %. It was confirmed from XRD patterns that, if $LaF_3$ was mixed in the raw materials in excess of 20 mol %, an unreacted $LaF_3$ phase was precipitated as an impurity phase. A synthesis method disclosed in Japanese Unexamined Patent Application Publication No. 2007-3208929 was just able to contain $F^-$ in the LaFeOAs phase in an amount of less than 3 mol %.

(Evaluation of Superconducting Transition Temperature of $F^-$-Added LaFeOAs)

Respective electrical resistances of the sintered polycrystalline body of LaFeOAs and the sintered polycrystalline body of LaFeOAs containing fluorine, both obtained as described above, were measured in the same manner as that used in COMPARATIVE EXAMPLE 1. The electrical resistance of the polycrystalline body of LaFeOAs not containing fluorine decreased, but it did not reach zero in the temperature range of 300K to 2 k. Thus, it did not develop the superconducting transition.

With the method for synthesizing the polycrystalline body of LaFeOAs, because it included the process of producing the mixture B, oxidation of the La metal during the synthesis process was reduced in comparison with the synthesis method disclosed in Japanese Unexamined Patent Application Publication No. 2007-320829, whereby the contents of $O^{2-}$ and As in the produced polycrystalline body of LaFeOAs were controlled to become close to values of the chemical equivalent composition. For that reason, presumably, the superconducting transition could not be observed.

Figure 5:
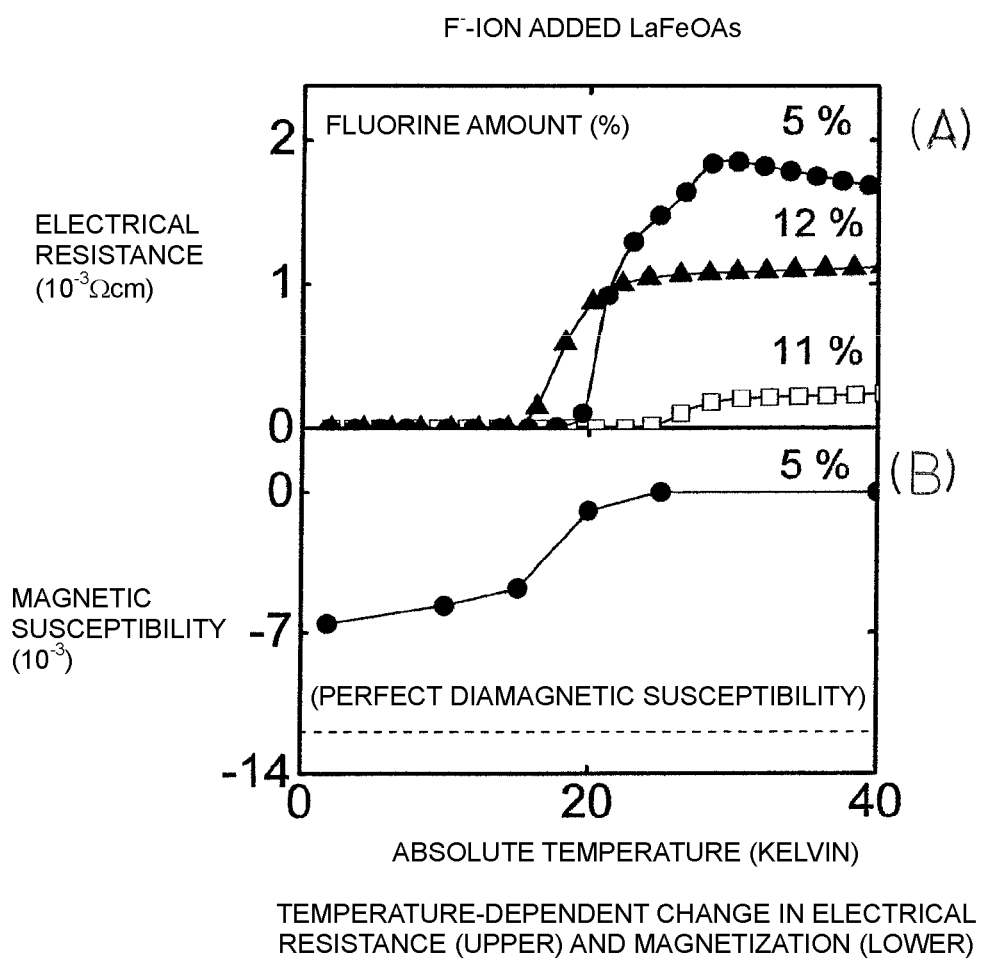
FIG. 5 is a graph showing temperature-dependent changes in electrical resistivity (A) and temperature-dependent changes in magnetization (B) of the sintered body obtained in EXAMPLE 3.

On the other hand, as shown in FIG. 5(A), the polycrystalline body of LaFeOAs added with 4 mol % or more of fluorine ions developed the superconducting transition such that its electrical resistance started to decrease at nearly 30K and reached zero nearly 20K. The fact that the resistance reaching zero represents the superconducting transition could be confirmed from FIG. 5(B) showing that the magnetization of the polycrystalline body of LaFeOAs containing 5 mol % of $F^-$ exhibited a large minus value.

Figure 6:
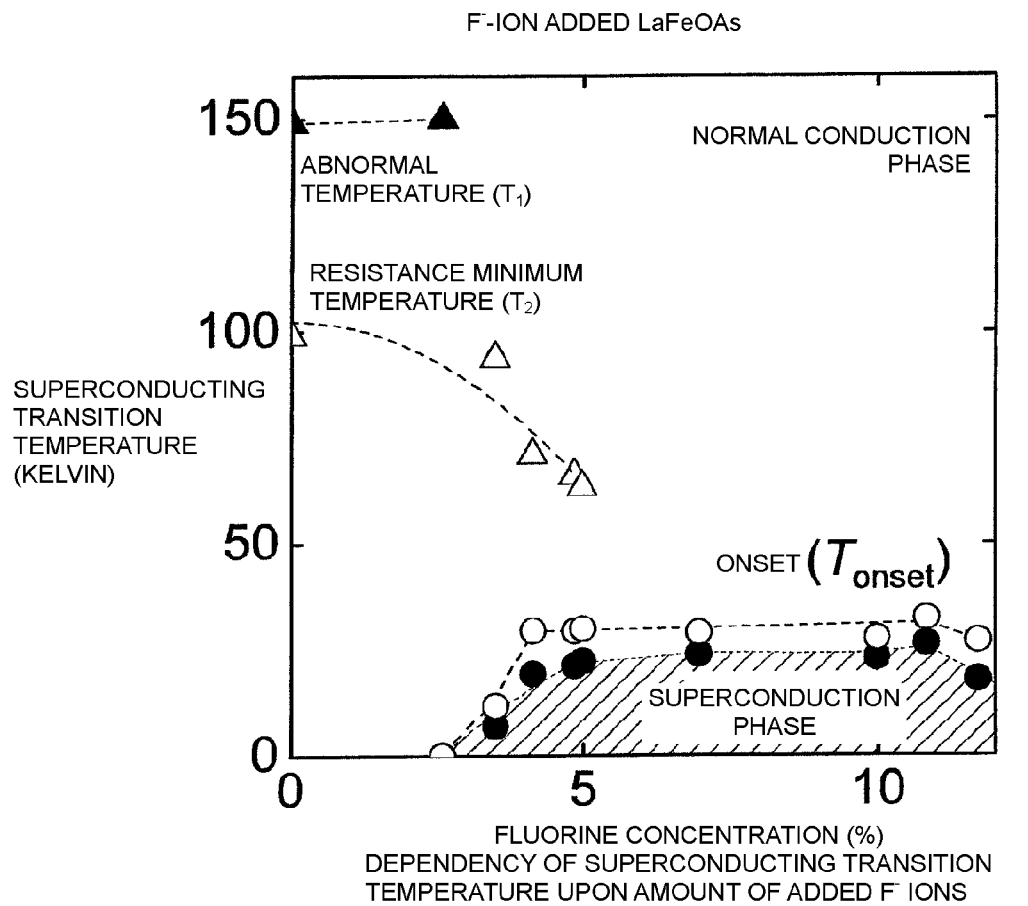
FIG. 6 is a graph showing dependency of the superconducting transition temperature of the sintered body obtained in EXAMPLE 3 upon an amount of added fluorine ions.

FIG. 6 shows dependency of the superconducting transition temperature of the sintered body obtained here upon an amount of the added fluorine ions. A black circle represents a midpoint transition temperature, and a white circle represents a temperature at which the electrical resistance starts to decrease (i.e., an offset transition temperature). As shown in FIG. 6, Tc depends upon the content of $F^-$ in the polycrystalline body of LaFeOAs such that the maximum superconducting transition temperature (i.e., the temperature at which the electrical resistance becomes ½ of that before the transition: called "midpoint transition temperature") is 26K when the content of $F^-$ is 11 mol %. Stated another way, it was proved that, by adding 4 mol % or more of $F^-$, the sintered polycrystalline body of LaFeOAs was caused develop the superconducting transition and Tc was raised to 20K or above.

COMPARATIVE EXAMPLE 4

Sintered Polycrystalline Body of LaNiOP

La (purity of 99.5 mol %, made by Shin-Etsu Chemical Co., Ltd.) and P (purity of 99.9999%, made by Rare Metallic Co., Ltd.) were mixed at a molar ratio of 1:1. An obtained mixture was enclosed in a silica tube together with an argon gas and was baked at 400° C. for 12 hours, thereby synthesizing LaP. This LaO and NiO (purity of 99.97%, made by Japan Pure Chemical Co., Ltd.) were mixed to prepare mixed powder C. The mixed powder C was shaped into a pellet by using a low-temperature press. The pellet was enclosed in a silica tube together with an argon gas and was sintered at 1,000° C. for 24 hours.

Figure 7:
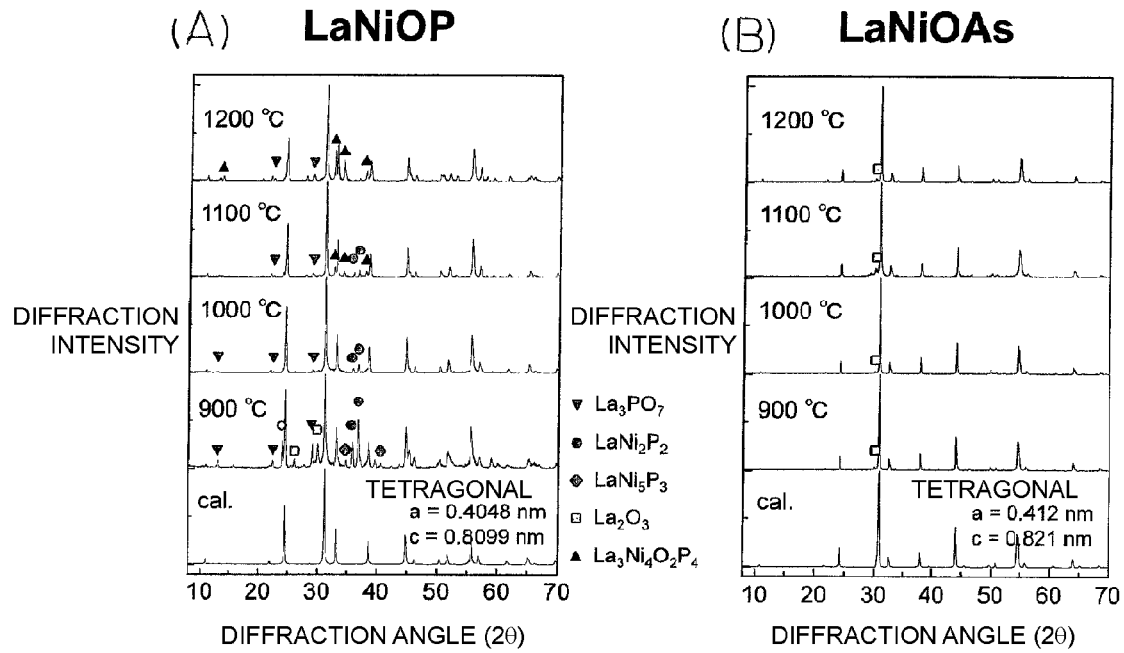
FIG. 7 shows X-ray diffraction patterns of sintered bodies obtained in COMPARATIVE EXAMPLE 4 and COMPARATIVE EXAMPLE 5.
Figure 8:
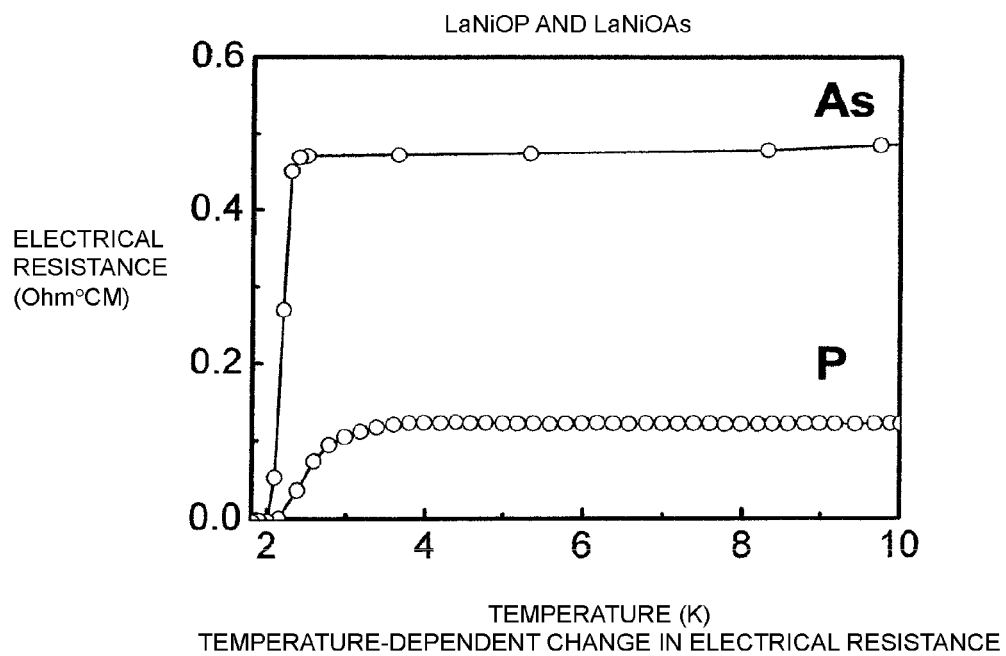
FIG. 8 is a graph showing temperature-dependent changes in electrical resistivity of the sintered bodies obtained in COMPARATIVE EXAMPLE 4 and COMPARATIVE EXAMPLE 5.
Figure 9:
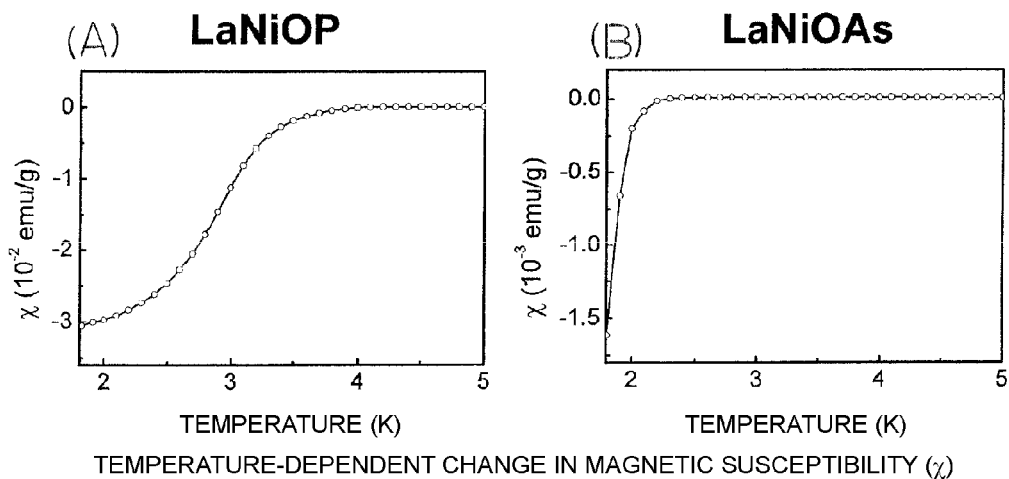
FIG. 9 is a graph showing temperature-dependent changes in magnetic susceptibility of the sintered bodies obtained in COMPARATIVE EXAMPLE 4 and COMPARATIVE EXAMPLE 5.

From an XRD pattern shown in FIG. 7(A), it was confirmed that a sintered body obtained here was a polycrystalline body of LaNiOP. Temperature-dependent changes in electrical resistance and magnetization of this sintered polycrystalline body of LaNiOP were measured in the same manner as that used in COMPARATIVE EXAMPLE 1. As shown in FIG. 8 and FIG. 9(A), it was proved that this polycrystalline body of LaNiOP was a superconductor having Tc of 2.5K.

EXAMPLE 4

Sintered Polycrystalline Body of LaNiOP Added with $F^-$, $Ca^{2+}$ or $Y^{3+}$

Figure 10:
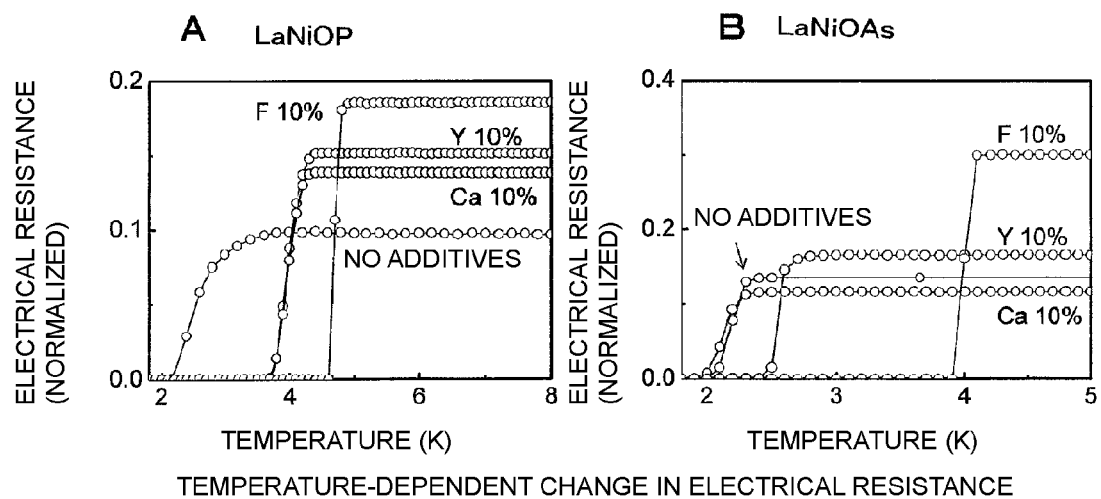
FIG. 10 is a graph showing temperature-dependent changes in electrical resistivity of the sintered bodies containing no additives and containing additives, which are obtained in COMPARATIVE EXAMPLE 4, EXAMPLE 4, COMPARATIVE EXAMPLE 5, and EXAMPLE 5.

A sintered polycrystalline body of LaNiOP added with $F^-$, $Ca^{2+}$ or $Y^{3+}$ was produced in the same manner as that used in COMPARATIVE EXAMPLE 4 by adding such an ion to LaNiOP. $F^-$ or $Ca^{2+}$ was added in the same manner as that used in EXAMPLES 1 and 2, respectively. $Y^{3+}$ was added in the same manner as that of adding $Ca^{2+}$ in EXAMPLE 2 by using $Y_2O_3$ instead of CaO. As shown in FIG. 10(A), Tc was raised with addition of $Y^{3+}$, $Ca^{2+}$ or $F^-$. In particular, a rise of Tc resulting from substituting an appropriate amount of $La^{3+}$ with $Y^{3+}$ proved that a reduction of the lattice constant was effective in raising Tc.

COMPARATIVE EXAMPLE 5

Polycrystalline Sintered Body of LaNiOAs

A sintered body was produced under the same conditions as those in COMPARATIVE EXAMPLE 4 except that P in COMPARATIVE EXAMPLE 4 was substituted with As. From an XRD pattern shown in FIG. 7(B), it was proved that the sintered body obtained here was a polycrystalline body of LaNiOAs having purity of 90% or more. Temperature-dependent changes in electrical resistance and magnetization of this polycrystalline body of LaNiOAs were measured by using the manner described in COMPARATIVE EXAMPLE 1. As shown in FIG. 8 and FIG. 9(B), it was proved that this polycrystalline body of LaNiOAs was a superconductor having Tc of 4K.

EXAMPLE 5

Polycrystalline Sintered Body of LaNiOAs Added with $F^-$, $Ca^{2+}$ or $Y^{3+}$ A sintered body of LaNiOAs added with $F^-$, $Ca^{2+}$ or $Y^{3+}$ was produced in the same manner as that used in EXAMPLE 4 by adding such an ion to LaNiOAs. As shown in FIG. 10(B), Tc was raised with addition of $Y^{3+}$, $Ca^{2+}$ or $F^-$. In particular, a rise of Tc resulting from substituting an appropriate amount of $La^{3+}$ with $Y^{3+}$ proved that a reduction of the lattice constant was effective in raising Tc.

COMPARATIVE EXAMPLE 6

Polycrystalline Sintered Body of SmFeAsO $Sm_2O_3$ powder (purity of 99.99 weight %, made by Rare Metallic Co., Ltd.) was heat-treated in air at 1000° C. for 5 hours and then dehydrated. A Sm metal (purity of 99.9 weight %, made by Nilaco Corporation), a Fe metal (purity of 99.9 weight % or more, made by Japan Pure Chemical Laboratory Co., Ltd.), and an As metal (purity of 99.9999 weight %, made by Japan Pure Chemical Laboratory Co., Ltd.) were mixed at an equivalent ratio of 1:3:3 in terms of metal element ratio and were enclosed in a quartz tube. Then, the quartz tube was heated for baking at 850° C. for 10 hours. SmAs—$Fe_2As$—FeAs mixed powder (called a mixture C) was obtained with the baking.

The dehydrated $Sm_2O_3$ powder and the mixed powder C were mixed at an equivalent ratio of 1:1 and were pressed under pressure to prepare a pellet. The pellet was enclosed in a quartz tube filled with an argon gas at 0.2 atm and was sintered at 1300° C. for 15 hours. From an X-ray diffraction pattern (x=0 in FIG. 11(b)), it was proved that a sintered body obtained here was a polycrystalline sintered body of SmFeAsO having the ZrCuSiAs-type crystal structure (FIG. 11(a)). FeAs was contained as an impurity phase in the polycrystalline sintered body, but its amount (weight %) was less than 5%.

EXAMPLE 6

Polycrystalline Sintered Body of $F^-$-Added SmFeAsO $SmF_3$ (purity of 99.99 weight %, made by Rare Metallic Co., Ltd.) and Sm metal powder (purity of 99.5 weight %, made by Rare Metallic Co., Ltd.) were added at rates of setting weight % to the anhydrous $Sm_2O_3$ powder prepared in COMPARATIVE EXAMPLE 6. This mixed powder and the mixture C were enclosed in a quartz tube together with an argon gas and were sintered at 1300° C. for 15 hours in the same manner as that described in COMPARATIVE EXAMPLE 6.

Figure 11:
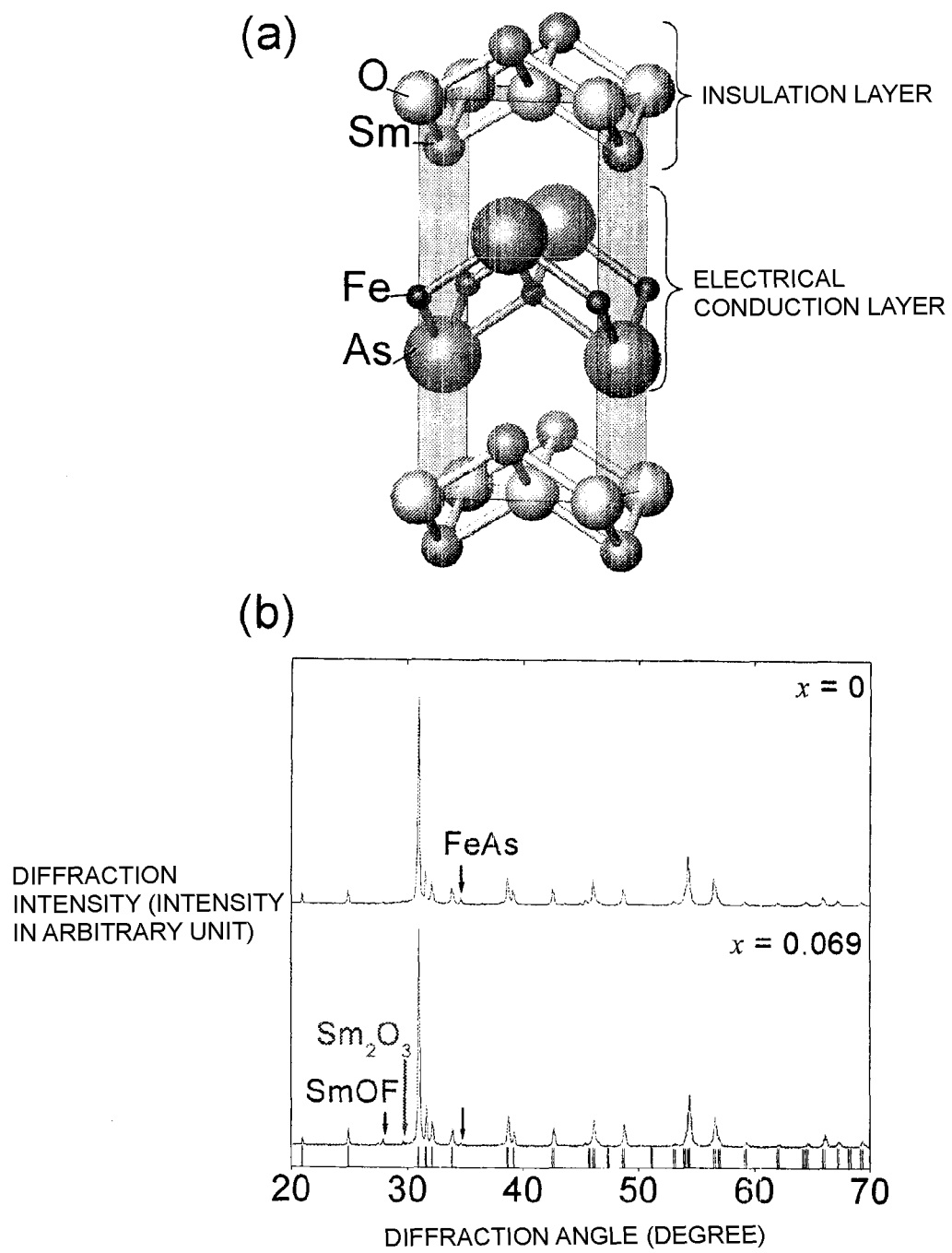
FIG. 11(a) shows a ZrCuSiAs-type crystal structure of a sintered body obtained in COMPARATIVE EXAMPLE 6.
FIG. 11(b) shows X-ray diffraction patterns of the sintered bodies obtained in COMPARATIVE EXAMPLE 6 and EXAMPLE 6.

From an X-ray diffraction spectrum (x=0.069 in FIG. 11(b)), it was proved that a baked pellet obtained here was $SmFeAsO_{1-x}F_x$ (x represents an atomic ratio of the fluorine content) having the ZrCuSiAs-type crystal structure. It was also proved that the lattice constant of $SmFeAsO_{1-x}F_x$ was reduced in comparison with that of SmFeAsO and O was partially substituted with F ions. The fluorine content was determined from the lattice constant. A value of weight % determined from the lattice constant was substantially in agreement with the initially loaded amount. In addition, FeAs, $Sm_2O_3$, and SmOF were contained therein as impurity phases, but their total weight was less than 5%.

(Measurement of Temperature-Dependent Changes in Electrical Conductivity and Magnetization of Polycrystalline Sintered Body of F⁻-Added SmFeAsO)

Figure 12:
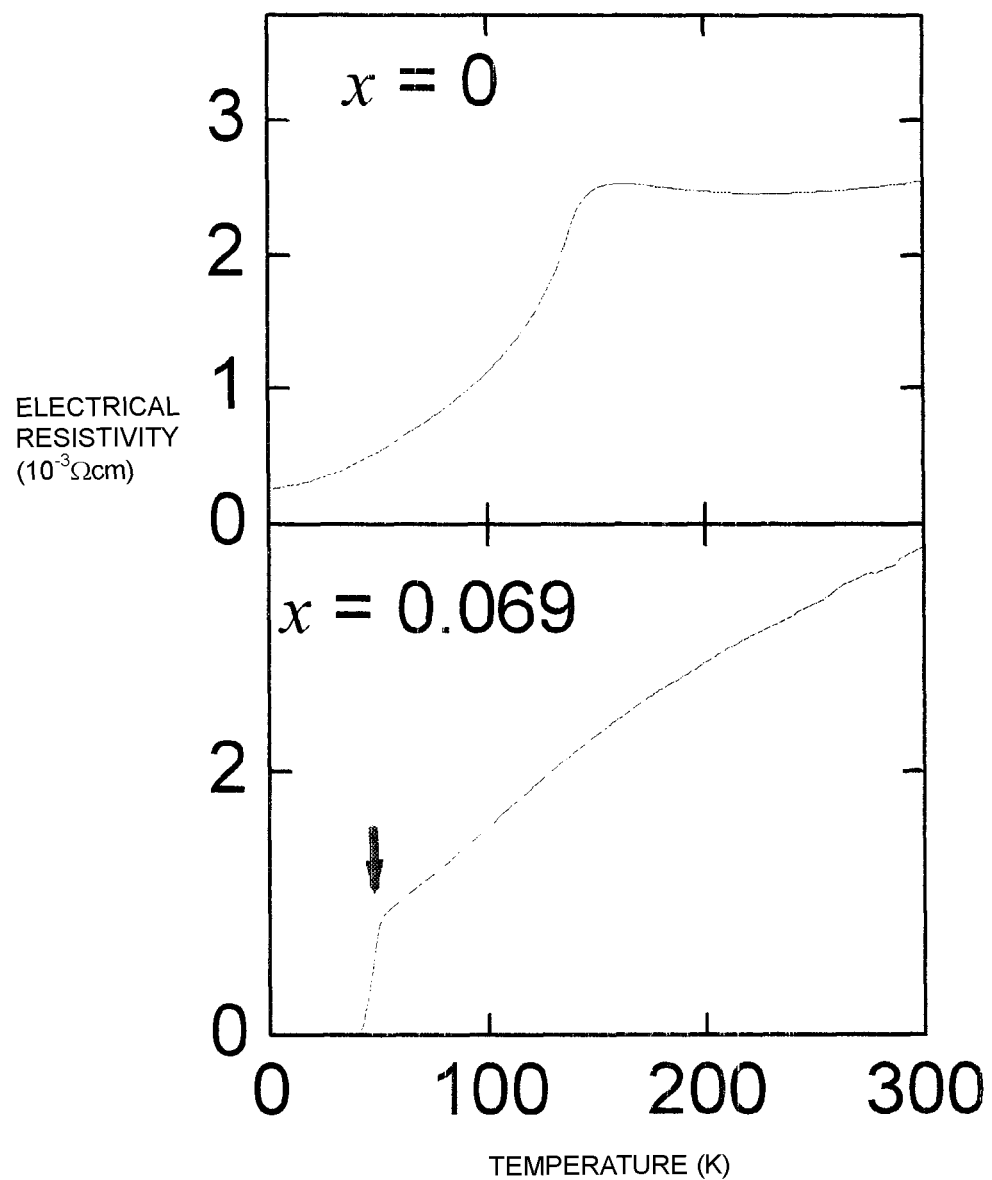
FIG. 12 is a graph showing temperature-dependent changes in electrical resistivity of the sintered bodies obtained in COMPARATIVE EXAMPLE 6 and EXAMPLE 6.

The electrical resistance and the magnetization of each of the polycrystalline sintered bodies obtained in COMPARATIVE EXAMPLE 6 and EXAMPLE 6 were measured over the range of 4.2K to 300K. The electrical conductivity was measured by employing the 4-terminal method, and the magnetization was measured by using a sample vibrating magnetometer (PPMS VSM option; made by Quantum Design Co.). For F⁻-added $SmFeAsO_{1-x}F_x$ (x=0.069) in which oxygen was substituted with 6.9 atom % of fluorine, it was proved that the electrical resistance reached zero and a superconducting state was developed at low temperature (FIG. 12).

Figure 13:
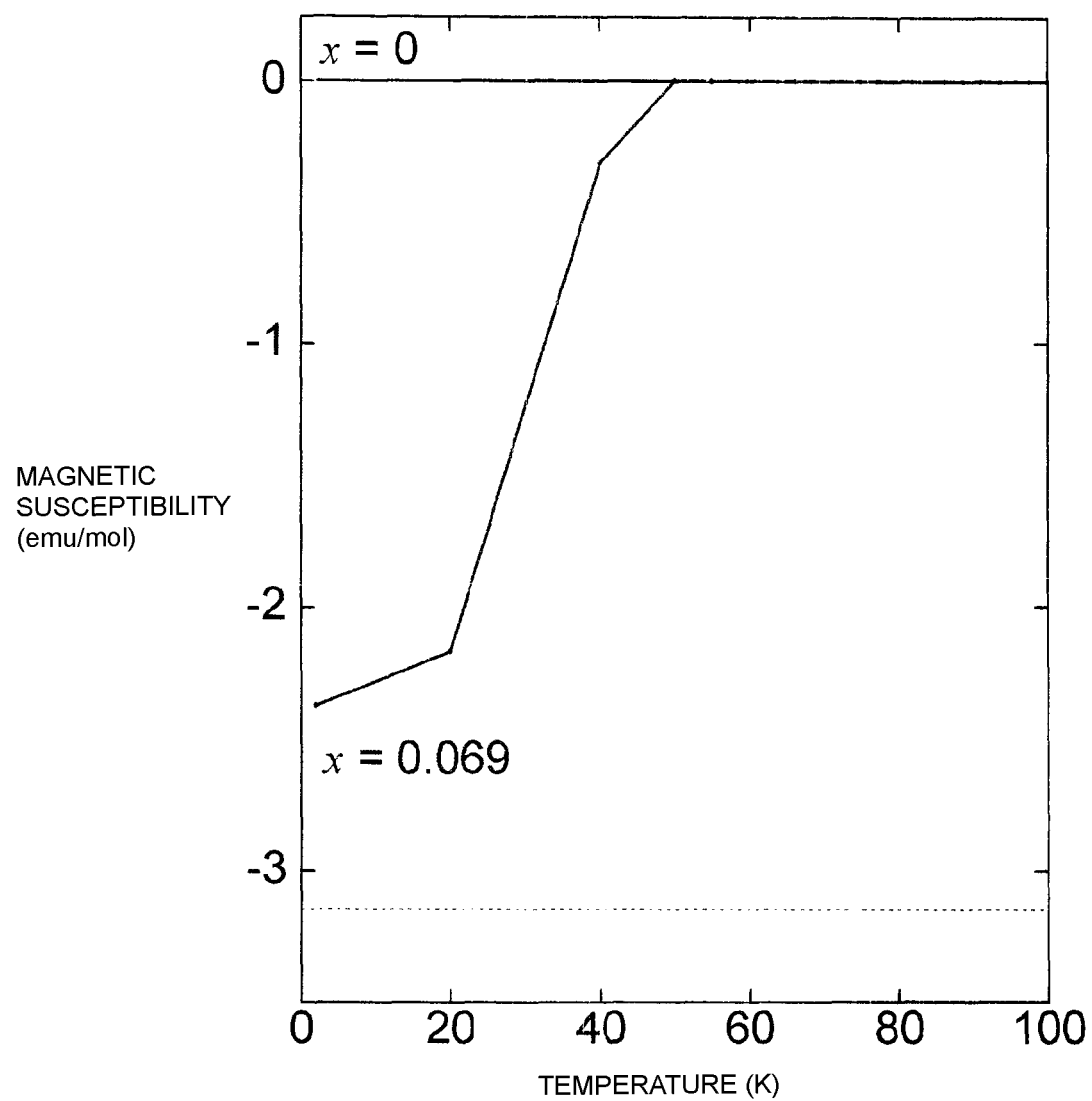
FIG. 13 is a graph showing temperature-dependent changes in magnetic susceptibility of the sintered bodies obtained in COMPARATIVE EXAMPLE 6 and EXAMPLE 6.
Figure 14:
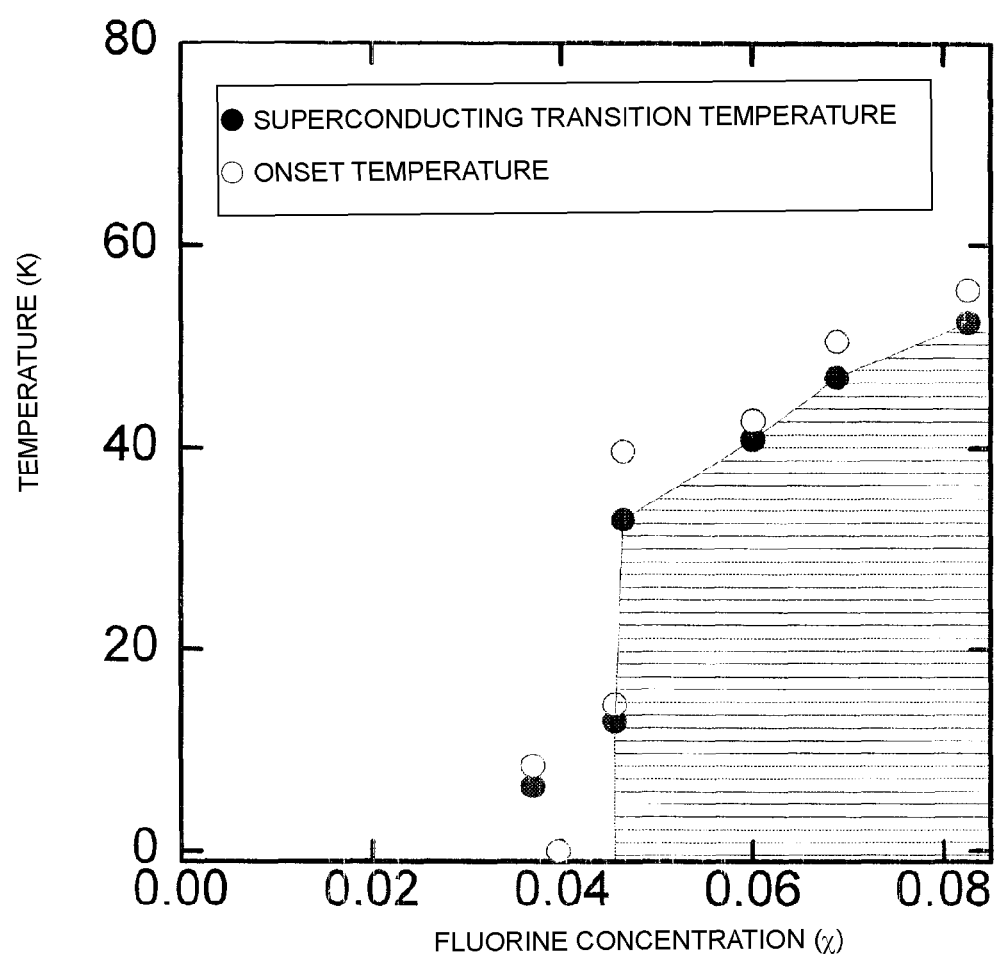
FIG. 14 is a graph showing dependency of the superconducting transition temperature of the sintered body obtained in EXAMPLE 6 upon an amount of added fluorine ions.

Further, for the sample of x=0 (in which fluorine is not doped), the magnetization increased with temperature and exhibited a positive value at all temperatures. On the other hand, for the sample of x=0.069, the magnetization increased with temperature, but it quickly decreased nearly Tc and the Meissner effect providing a negative value of the magnetization was observed (FIG. 13). FIG. 14 shows the superconducting transition temperature (denoted by a black circle) and the onset temperature (denoted by a white circle). The superconducting transition temperature take a finite value at values of x from x=0.045 and then quickly increases with in increase of the fluorine content. However, an increase rate of the superconducting transition temperature reduces soon thereafter. The obtained maximum superconducting transition temperature was about 55K. Stated another way, it was proved that SmFeAsO containing no fluorine did not exhibit superconductivity, but it changed to a superconductor with addition of fluorine.

INDUSTRIAL APPLICABILITY

The superconducting compound of the present invention is an oxypnictide compound containing a transition metal unlike the known superconducting compound based on the perovskite-type copper oxide, and it can be inexpensively produced. Further, the present invention provides a superconducting compound group that can further raise Tc to higher temperature and can increase the critical magnetic field by changing the chemical composition.

The invention claimed is:

1. A method for producing the superconducting compound, comprising:
    dehydrating $La_2O_3$ by heating in air, thereby obtaining anhydrous $La_2O_3$;
    mixing La metal, TM metal, and Ph element in a ratio of 1:3:3 to obtain a first mixture, wherein TM is one or more selected from Fe, Ru, Os, Ni, Pd, and Pt; and Ph is one or more pnictide elements selected from N, P, As, and Sb, and sintering the obtained first mixture in a dry inert gas atmosphere, thereby obtaining sintered mixture 1 including LaPh, $TM_2Ph$, and TMPh;
    replacing 4-20 mol % of anhydrous $La_2O_3$ with mixed powder of $LaF_3$ and La metal in a ratio of 1:1, thereby obtaining mixture 2 including $La_2O_3$, $LaF_3$ and La metal; and
    mixing the sintered mixture 1 and the mixture 2 such that molar ratio of La and TM becomes 1:1 to obtain a third mixture, and sintering the obtained third mixture at 1100-1250° C. in an inert gas atmosphere, thereby obtaining a compound, which is represented by a chemical formula of LaTMOPh, oxygen ions of which are substituted with 4-20 mol % F⁻ ions, forming a superconducting compound of which superconducting transition temperature is controlled in accordance with an ion substitution amount; wherein the superconducting compound has a maximum superconducting transition temperature of 25K or higher.

2. The method for producing the superconducting compound according to claim 1, wherein the LaTMOPh is polycrystalline LaFeOAs and has a maximum superconducting transition temperature of 26K.

3. The method for producing the superconducting compound according to claim 1, wherein the LaTMOPh is polycrystalline SmFeOAs and has a maximum supercoding transition temperature of 55K.

* * * * *